United States Patent
Keane

(10) Patent No.: US 11,431,322 B2
(45) Date of Patent: Aug. 30, 2022

(54) CAPACITIVELY-DRIVEN TUNABLE COUPLING

(71) Applicant: Zachary Kyle Keane, Baltimore, MD (US)

(72) Inventor: Zachary Kyle Keane, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/383,779

(22) Filed: Jul. 23, 2021

(65) Prior Publication Data

US 2021/0359666 A1    Nov. 18, 2021

Related U.S. Application Data

(63) Continuation of application No. 15/868,557, filed on Jan. 11, 2018, now Pat. No. 11,108,380.

(51) Int. Cl.
```
H03H 11/04      (2006.01)
H01L 39/22      (2006.01)
H01L 39/02      (2006.01)
H03K 19/0175    (2006.01)
H03K 19/195     (2006.01)
H03K 3/38       (2006.01)
```
(52) U.S. Cl.
CPC ........... *H03H 11/04* (2013.01); *H01L 39/025* (2013.01); *H01L 39/223* (2013.01); *H03K 3/38* (2013.01); *H03K 19/017509* (2013.01); *H03K 19/017545* (2013.01); *H03K 19/1952* (2013.01)

(58) Field of Classification Search
CPC .............. H03H 11/04; H03K 19/195; H03K 19/017545; H03K 3/38; H03K 19/017509; H03K 19/1952; Y10S 505/832; Y10S 505/864; Y10S 505/865; H01L 39/025; H01L 39/223
See application file for complete search history.

(56) References Cited

U.S. PATENT DOCUMENTS

| | | |
|---|---|---|
| 4,800,345 A | 1/1989 | Podell et al. |
| 5,036,279 A | 7/1991 | Jonsen |

(Continued)

FOREIGN PATENT DOCUMENTS

| | | |
|---|---|---|
| EP | 2730029 A2 | 5/2014 |
| EP | 3254375 A1 | 12/2017 |

(Continued)

OTHER PUBLICATIONS

Korean Office Action for corresponding KR 10-2017-0085533 dated Aug. 27, 2021.

(Continued)

*Primary Examiner* — Jung Kim
(74) *Attorney, Agent, or Firm* — Tarolli, Sundheim, Covell & Tummino LLP

(57) ABSTRACT

A capacitively-driven tunable coupler includes a coupling capacitor connecting an open end of a quantum object (i.e., an end of the object that cannot have a DC path to a low-voltage rail, such as a ground node, without breaking the functionality of the object) to an RF SQUID having a Josephson element capable of providing variable inductance and therefore variable coupling to another quantum object.

19 Claims, 7 Drawing Sheets

(56) References Cited

U.S. PATENT DOCUMENTS

| | | | |
|---|---|---|---|
| 5,053,706 | A | 10/1991 | Ohkawa |
| 5,552,735 | A | 9/1996 | Kang et al. |
| 5,818,308 | A | 10/1998 | Tanaka et al. |
| 6,346,863 | B2 | 2/2002 | Sasaki et al. |
| 6,407,647 | B1 | 6/2002 | Apel et al. |
| 6,636,126 | B1 | 10/2003 | Pozdeev |
| 6,747,525 | B2 | 6/2004 | Iida et al. |
| 6,765,455 | B1 | 7/2004 | De Lillo |
| 6,806,558 | B2 | 10/2004 | Apel |
| 7,969,178 | B2 | 6/2011 | Przybysz et al. |
| 9,257,736 | B1 | 2/2016 | Josypenko |
| 9,501,748 | B2 | 11/2016 | Naaman et al. |
| 9,647,662 | B1 | 5/2017 | Abutaleb et al. |
| 9,710,758 | B2 | 7/2017 | Bunyk et al. |
| 9,722,589 | B1 | 8/2017 | Talanov et al. |
| 9,768,771 | B2 | 9/2017 | Naaman |
| 9,928,948 | B2 | 3/2018 | Naaman et al. |
| 10,042,805 | B2 | 8/2018 | Naaman et al. |
| 10,133,299 | B1 | 11/2018 | Strong et al. |
| 10,852,366 | B2 | 12/2020 | Ferguson et al. |
| 10,886,049 | B2 | 1/2021 | Strong |
| 2003/0218516 | A1 | 11/2003 | Gilbert et al. |
| 2004/0189388 | A1 | 9/2004 | Nguyen et al. |
| 2006/0147154 | A1 | 7/2006 | Thom et al. |
| 2006/0220737 | A1 | 10/2006 | Sanderson |
| 2008/0048762 | A1 | 2/2008 | Inamdar et al. |
| 2008/0238531 | A1 | 10/2008 | Harris |
| 2009/0078931 | A1 | 3/2009 | Berkley |
| 2009/0189712 | A1 | 7/2009 | Jiang |
| 2010/0148853 | A1 | 6/2010 | Harris et al. |
| 2010/0182039 | A1 | 7/2010 | Baumgardner et al. |
| 2011/0054876 | A1 | 3/2011 | Biamonte et al. |
| 2013/0009677 | A1 | 1/2013 | Naaman et al. |
| 2015/0254571 | A1 | 9/2015 | Miller et al. |
| 2015/0263736 | A1 | 9/2015 | Herr et al. |
| 2016/0112031 | A1* | 4/2016 | Abraham ............... H03K 17/92 327/528 |
| 2016/0233860 | A1 | 8/2016 | Naaman |
| 2016/0335558 | A1 | 11/2016 | Bunyk et al. |
| 2016/0335560 | A1 | 11/2016 | Mohseni et al. |
| 2017/0062107 | A1 | 3/2017 | Naaman et al. |
| 2017/0127205 | A1 | 5/2017 | Lin |
| 2017/0201224 | A1 | 7/2017 | Strong et al. |
| 2017/0212860 | A1 | 7/2017 | Naaman et al. |
| 2017/0286859 | A1 | 10/2017 | Harris et al. |
| 2018/0091115 | A1 | 3/2018 | Abdo |
| 2019/0007051 | A1 | 1/2019 | Sete et al. |
| 2019/0385088 | A1 | 12/2019 | Naaman et al. |

FOREIGN PATENT DOCUMENTS

| | | |
|---|---|---|
| JP | H0199479 A | 4/1989 |
| JP | 2007074120 A | 3/2007 |
| JP | 2010524064 A | 7/2010 |
| JP | 2013-058705 A | 3/2013 |
| JP | 2010517371 A | 12/2013 |
| KR | 20170085533 A | 7/2017 |
| WO | 9836467 | 8/1998 |
| WO | 20100028183 A1 | 3/2010 |
| WO | 2014028302 A2 | 2/2014 |
| WO | 20160126981 A1 | 8/2016 |
| WO | 2016199029 A1 | 12/2016 |
| WO | 2017027733 A1 | 2/2017 |
| WO | 2017062143 A1 | 4/2017 |
| WO | 20170058194 A1 | 4/2017 |
| WO | 2017082983 A3 | 5/2017 |
| WO | 2017111949 | 6/2017 |
| WO | 2017/127205 A1 | 7/2017 |
| WO | 2017022806 A1 | 12/2017 |

OTHER PUBLICATIONS

Chen, et al.: "Qubit Architecture with High Coherence and Fast Tunable Coupling" Physical Review Letters; PRL 113, 220502 (2014) Nov. 28, 2014, pp. 220502-1 thru 220502-5.

Ehara K et al: "Development of Pulse Transfer Circuits for Serially Biased SFQ Circuits Using the Nb 9-Layer 1-$\mu\hbox{m}$ Process", IEEE Transactions on Applied Superconductivity, IEEE Service Center, Los Alamitos, CA, US, vol. 23, No. 3, Jun. 1, 2013 (Jun. 1, 2013), p. 1300504, XP011513813, ISSN: 1051-8223, DOI: 10. 1109/TASC.2012.2233535 figure 1.

Chiarello, et al: Superconducting tunable flux qubit with direct readout scheme: Superconducting tunable flux qubit with direct readout scheme:. Superconductor Science and Technology, IOP Publishing,K Techno House, Bristol, GB, vol. 18, No. 10, Oct. 1, 2005, pp. 1370-1373, XP020087996, ISSN: 0953-2048, DOI: 10.1088/0953-2048/18/10/021 Sections 1-3; figures 1, 2.

Ferguson et al: "Non-stoquastic XX couplers for superconducting flux qubits", Abstract submitted to the APS March Meeting 2017, Jan. 4, 2017, XP055469302, Retrieved from the Internet: URL: http://absimage.aps.org/image/Mar17/MWS_Mar17-2016-008291. pdf, abstract.

Samach, et al.: "Coupled qubits for next generation quantum annealing: novel interactions", Abstract submitted to he APS March Meeting 2017, Jan. 4, 2017, XP055469301, Retrieved from the Internet: URL: http://absimage.aps.org/image/MAR17-2016-003302. pdf, abstract.

Harris, et al: "Sign- and magnitude-tunable coupler for superconducting flux qubits", arxiv.org, Cornell University Library, 201 Olin Library Cornell University Ithaca, NY 14853, Aug. 11, 2006 (Aug. 11, 2006), XP080248067, DOI: 10.1103/PHYSREVLETT.98. 177001 figure 1.

Birenbaum, "The C-shunt Flux Qubit: A New Generation of Superconducting Flux Qubit", eScholarship, (Jan. 1, 2014), URL: https://escholarship.org/uc/item/3gg7j6rh, (Sep. 27, 2018).

Kang, et al.: "Current recycling and SEQ signal transfer in large scale RSFQ circuits", IEEE Transactions on Applied Superconductivity, IEEE Service Enter, Los Alamitos, CA, US, vol. 13, No. 2, Jun. 1, 2003 (Jun. 1, 2003), pp. 547-550, XP011097824, ISSN: 1051-8223, DOI: 10. 1109/TASC.2003.813932 figure 2.

Lanting et al.: "Cotunneling in pairs of coupled flux qubits", Physical Review B, vol. 82, 060512R, Aug. 23, 2010, XP055469296, figures 1(a) & (b).

Lu: "Master Thesis Towards Tunable Coupling Between Two Superconducting Transmission Line Resonators"; Aug. 24, 2012 (Aug. 24, 2012), XP055585125, Retrieved from the Internet:URL:https://www.wmi.badw.de/publications/theses/Xiaoling, Lu Master Thesis 2012.pdf [retrieved on May 2, 2019]; abstract, section 1, section 2, section 3, section 4.

Majer, et al.: "Coupling Superconducting Qubits via a Cavity Bus", Nature, vol. 449, Sep. 27, 2007, doi:10.1038/nature06184.

Rafique et al.: Tunable filter based on DC-SQUID chain 1; May 1, 2007 (May 1, 2007), pp. 1-2, XP055585121, DOI: 10.13140/RG. 2.1.1612.5688, Retrieved from the Internet: URL:https://www.researchgate.net/profile/RaihanRafique2/publication/305769905 Tunable filter based on DC SQUID chain/links/57a07d4408ae94f454eb0968/Tunable-filter-based-on-DC-SQUID-chain.pdf [retrieved on May 2, 2019].

Srinivasan, et al.: "Tunable Coupling in Circuit Quantum Electrodynamics Using a Superconducting Charge Qubit with a V-Shaped Energy Level Diagram"; American Physical Society, Physical Review Letters, PRL 106, 083601 (2011), Feb. 25, 2011, p. 083601-1 thru 083601-4.

Tuorila et al: "Efficient protocol for qubit initialization with a tunable environment", arxiv.org, Cornell University Library, 201, Olin Library Cornell University Ithaca, NY 14853, Dec. 13, 2016 (Dec. 13, 2016), XP080743892, DOI: 10.1038/S41534-017-0027-1; abstract, figures 1-3, p. 1, line 1-p. 7, last line.

Worsham A H et al: "A Single Flux Quantum cross-bar switch and demultiplexer" IEEE Transactions on Applied Superconductivity, IEEE Service Center, Los Alamitos, CA, US, vol. 5, No. 2, Jun. 1,

(56) References Cited

OTHER PUBLICATIONS 1995 (Jun. 1, 1995), pp. 2996-2999, XP011504599, ISSN: 1051-8223, DOI: 10.1109/77.403222 Section II.; figure 1.
Mauro: "What is the self-resonant frequency of a capacitor?"; found on the internet at: https://www.quora.com/What-is-the-self-resonant-frequency-of-a-capacitor on Jul. 23, 2021.
Kafri, et al.: "Tunable inductive coupling of superconducting qubits in the strongly nonlinear regime"; DOI: 10.1103/PhysRevA.95.052333arXiv:1606.08382v2 [quant-ph] Jan. 23, 2017.
Robertson, et al: "Superconducting device to isolate, entangle, and read out quantum flux states"; found on the internet Jul. 23, 2021 at: https://www.researchgate.net/profile/B-Chesca/publication/255276503_Superconducting_device_to_isolate_entangle_and_read_out_quantum_flux_states/links/56efd9e608ae01ae3e70df29/Superconducting-device-to-isolate-entangle-and-read-out-quantum-flux-states.pdf.
Schmitt, et al.: "Multiplexed readout of transmon qubits with Josephson bifurcation amplifiers"; Physical Review A90, 062333 (2014); DOI: 10.1103/PhysRevA.90.06233.
Japanese Office Action for Application No. 2020-536597 dated Jul. 13, 2021.
Korean Office Action for Application No. 10-2019-7025610 dated Jul. 23, 2021.

\* cited by examiner

CAPACITIVELY-DRIVEN TUNABLE COUPLING

GOVERNMENT INTEREST

The invention was made under Government Contract Number 30069353. Therefore, the US Government has rights to the invention as specified in that contract.

RELATED APPLICATIONS

This application claims priority from U.S. patent application Ser. No. 15/868,557, filed 11 Jan. 2018, which is incorporated herein in its entirety.

TECHNICAL FIELD

The present invention relates generally to superconducting circuits, and specifically to capacitively-driven tunable coupling of quantum objects.

BACKGROUND

Conventional microwave mechanical, electro-mechanical, and electronic switches may not compatible with on-chip integration with, and cryogenic operation of, superconducting electronic circuits, because of incompatible fabrication processes and high power dissipation. Likewise, tunable filters that are commonly realized by use of either active components such as voltage-variable capacitors (i.e., varactors), mechanical drivers, or ferroelectric and ferrite materials, are not easily controllable by signal levels that can be generated with single flux quantum (SFQ) technologies, and many are not operable at cryogenic temperatures. While superconducting microwave filters, both fixed and tunable, have been previously realized using both high temperature and low temperature superconductors, their use in switching applications suffers from high return loss, limited usable bandwidth, and poor out-of-band off-state isolation.

In certain superconducting contexts, a coupler can be provided to exchange information between objects by turning on some coupling between them, or to isolate the objects by turning off that coupling. A tunable coupler is one that controls a degree of signal coupling between two objects, i.e., between pure "on" (coupled) and pure "off" (uncoupled) states, by the provision of one or more variable control signals.

SUMMARY

The capacitively-driven tunable coupler described herein leverages a coupling capacitor to connect an open end of a quantum object (i.e., an end of the object that cannot have a DC path to a low-voltage rail, such as a ground node, without breaking the functionality of the object) to an RF SQUID having a Josephson element capable of providing variable inductance and therefore variable coupling to another quantum object.

One example provides a superconducting capacitively-driven tunable coupler system that tunably couples and uncouples first and second quantum objects each having a ground end required to be connected to a DC path to a low-voltage rail and an open end required not to be connected to a DC path to the low-voltage rail. A coupler includes a first coupling capacitor connected between the open end of the first quantum object and a first connecting node, a radio-frequency superconducting quantum interference device (RF SQUID) connected between the first connecting node and a second connecting node, the RF SQUID comprising a Josephson element connected between the first connecting node and the second connecting node, and at least one flux injection element configured to bias the Josephson element to variably weaken the strength of coupling between the first and second quantum objects. Injected flux can uncouple the objects and thereby isolate the objects from exchanging signals between them. In the absence of injected flux, the objects are coupled together to pass signals between them.

In another example, a superconducting capacitively-driven tunable coupler system tunably couples and uncouples first and second quantum objects each having a ground end and an open end. The system includes a coupling capacitor connected between the open end of the first quantum object and a first connecting node, a first inductor connected between the first connecting node and the low-voltage rail, a Josephson element connected between the first connecting node and a second connecting node, and a second inductor connected between the second connecting node and the low-voltage rail. The ground end of the second quantum object is connected to the second connecting node.

In yet a further example, a superconducting capacitively-driven tunable coupler system tunably couples and uncouples first and second quantum objects each having a ground end and an open end. The system includes a first coupling capacitor connected between the open end of the first quantum object and a first connecting node, a first inductor connected between the first connecting node and the low-voltage rail, a Josephson element connected between the first connecting node and a second connecting node, a second inductor connected between the second connecting node and the low-voltage rail, and a second coupling capacitor connected between the second connecting node and the open end of the second quantum object.

DETAILED DESCRIPTION

This disclosure relates generally to superconducting circuits, and more particularly to a capacitively-driven tunable coupler between two quantum objects (e.g. qubits or resonators). The applicability of tunable couplers that couple inductively is limited in certain situations. For instance, a transmission line resonator has regions where the current flowing is essentially zero, while the voltage oscillations are at their maximum. Tunable couplers that couple inductively are unable to couple at these points, because inductive couplings only work where there is current flowing. Thus, for example, in the case of a half-wave resonator having one end shorted to a low-voltage rail (e.g., ground) and the other end left open, no current flows at the open end, so while an inductive coupling may be made to the end shorted to ground and where there is current there to couple to, an inductive coupling cannot be made to the open end of the half-wave resonator.

The superconducting capacitively-driven tunable coupler described herein can include a coupling capacitor and a radio-frequency superconducting quantum interference device (RF SQUID) to provide a tunable coupling element that works where inductive couplings are unavailable. The superconducting capacitively-driven tunable coupler described herein provides a tunable coupling element that can be driven capacitively by a voltage signal, rather than inductively by a current signal. The superconducting coupler can operate at cryogenic temperatures, dissipate substantially no power, and can be controlled with single flux quantum (SFQ) compatible signals.

Figure 1:
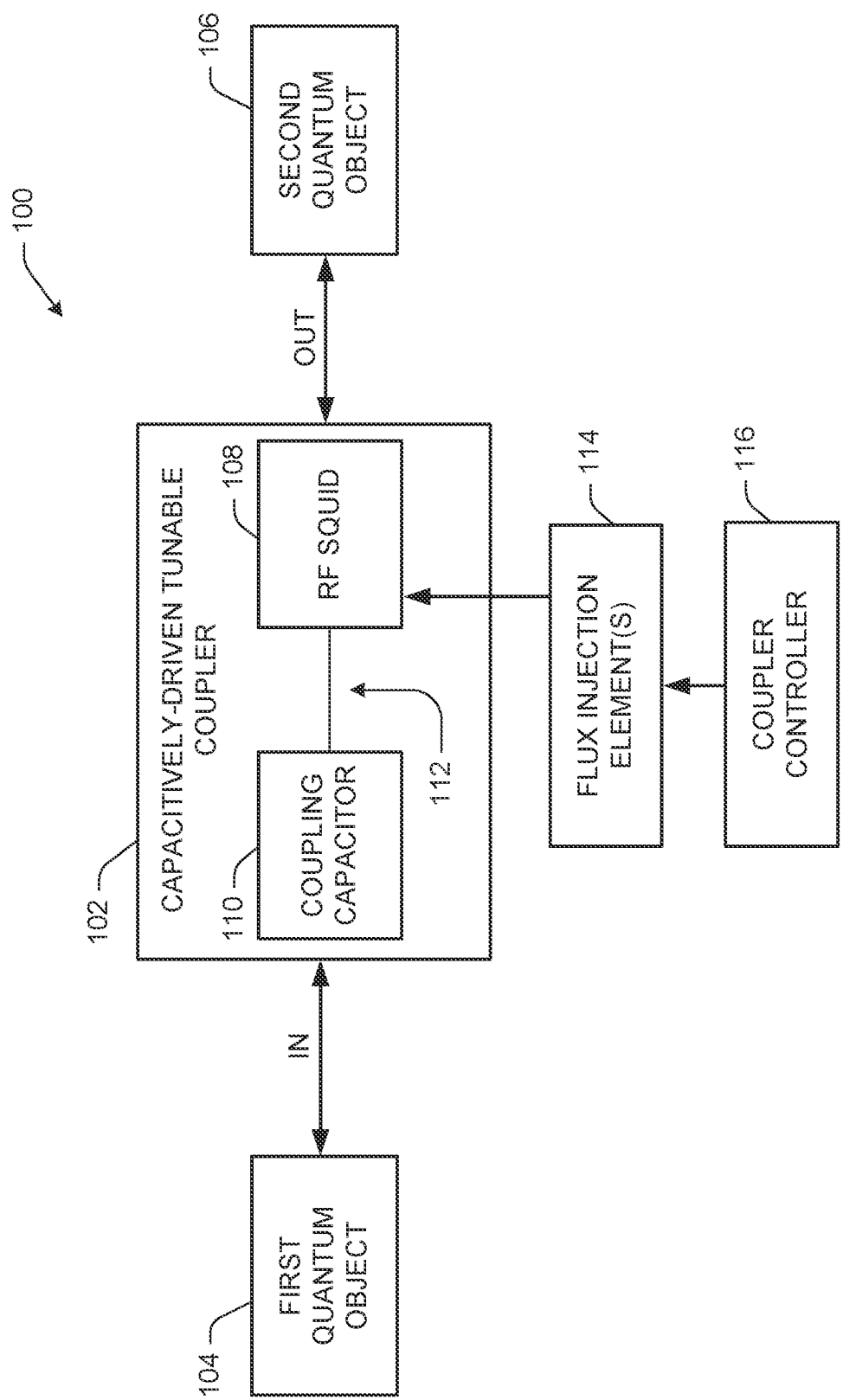
FIG. 1 is a block diagram of an example superconducting capacitively-driven tunable coupler.

As shown in the block diagram of FIG. 1, a capacitively-driven tunable coupler 102 couples a first quantum object 104 and a second quantum object 106 connected to the coupler 102 via ports. Although these ports have been nominally labeled "IN" and "OUT" in FIG. 1 for simplicity of discussion, the transmission of signals or exchange of information between the coupled objects can be bidirectional. The quantum objects 104, 106 can be qubits or resonators. One way to make a resonator of the type contemplated is with a completely passive transmission line (i.e., not a Josephson transmission line (JTL), which is active) with an appropriate choice of length and impedance. Coupler 102 consists of an RF SQUID 110 with a coupling capacitor 110 connected to one terminal of the RF SQUID 108 at connecting node 112. A Josephson element in the RF SQUID (not shown in FIG. 1) may be implemented, for example, as a single Josephson junction or as a compound Josephson junction, comprising, e.g., two Josephson junctions in parallel.

One or more flux injection elements 114 can be provided to the coupler 102, and specifically to its RF SQUID 108, to bias the RF SQUID 108 and thereby alter the inductance of the Josephson element in the RF SQUID 108 to be switched between, on the one hand, a low inductance state for coupling objects 104, 106 to one another and to pass signals between the coupled objects 104, 106, and, on the other hand, a high inductance state to decouple the objects from one another and thus to block signals from passing between the decoupled objects.

A coupler controller 116 can control the setting of the coupler 102 between an "off" (decoupled) state and various degrees of an "on" (coupled) state, by adjusting a Josephson element in RF SQUID 108 between opposing inductance states. For example, the coupler controller 116 can control an amount and polarity of control current through at least one flux injection element 114, e.g., through at least one flux bias control line inductively coupled to the RF SQUID 108.

Figure 2A:
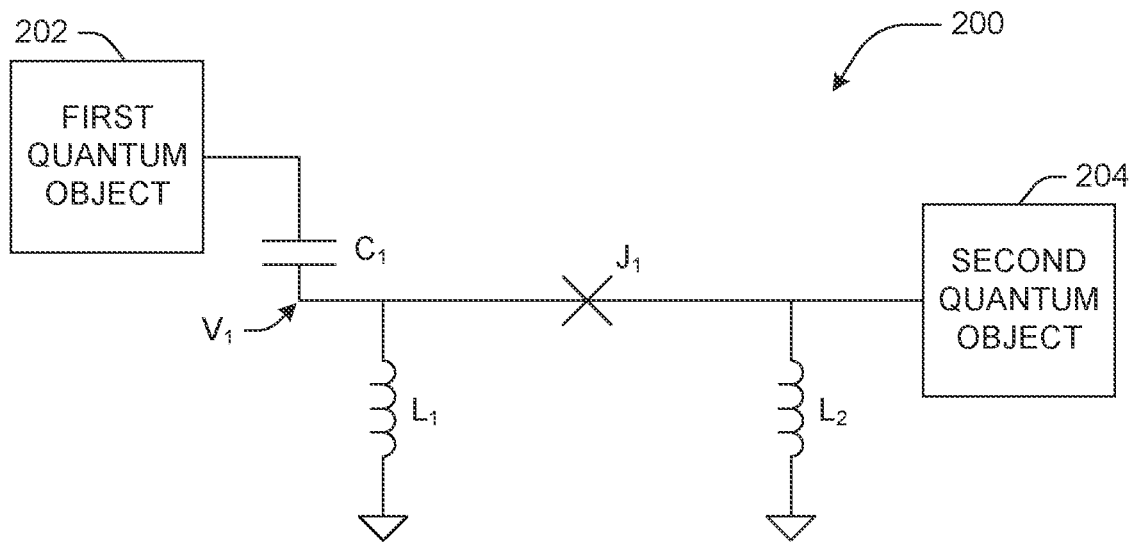
FIG. 2A is a schematic circuit diagram of an example superconducting capacitively-driven tunable coupler.

FIG. 2A provides a circuit schematic of an example capacitively-driven tunable coupler 200 that can correspond to coupler 102 in FIG. 1. Coupler 200 can couple first and second quantum objects 202, 204 corresponding to objects 104, 106 in FIG. 1. First inductor $L_1$, Josephson junction $J_1$, and second inductor $L_2$ in coupler 200 form an RF SQUID that can correspond to RF SQUID 110 in FIG. 1. This RF SQUID forms an inductive current divider that is driven through coupling capacitor $C_1$, which can correspond to capacitor 110 in FIG. 1, by a voltage on first object 202. Node $V_1$, where coupling capacitor $C_1$ connects to the RF SQUID, can correspond to connecting node 112 in FIG. 1.

For the sake of simplicity, flux injection elements are omitted from FIG. 2A. However, flux can be injected in a variety of ways, several of which are described herein and illustrated in FIGS. 2B-2I. First and second objects 202, 204 can be coupled with no flux applied via a control current, whereas a flux may be applied via one or more control currents to decouple the objects 202, 204. In the discussion that follows, the variable inductance of the Josephson element in the RQ SQUID (i.e., $J_1$ in the example of FIG. 2A) will be referred to as $L_J$.

In all of the examples described herein, first and second objects 202, 204 can be each of a type having two unlike ends, wherein one end must have a DC path to a low-voltage rail (e.g., ground), and one must not have a DC path to the low-voltage rail. These will be referred to, respectively, as a ground end and an open end. The examples of FIGS. 2A-2I can couple the open end of first object 202 (i.e., the end of object 202 that must not have a DC path to the low-voltage rail) to the ground end of second object 204 (i.e., the end of second object 204 that must have a DC path to the low-voltage rail). Whereas coupling together ground ends of objects 202, 204 (i.e., the ends of two objects that both require a DC path to the low-voltage rail) can make use of a tunable coupler that only couples inductively, such a coupler cannot be used to couple, for either object, the open end (i.e., the end that must not have a DC path to the low-voltage rail). In the instance where the open end of first object 202 is the end being coupled, replacing coupling capacitor $C_1$ with a short circuit would break the functionality of first object 202, because the open end of first object 202 requires that there not be a DC path to ground at that end.

The couplings and systems of the present disclosure make use of the discovery that a current in a ground-$L_1$-$L_J$-$L_2$-ground loop that is sufficient to result in a reasonable tunable coupling between the two objects can be achieved by placing an appropriately sized coupling capacitor $C_1$ between first object 202 and node $V_1$. When the LC time constant of the series circuit formed by the coupling capacitor $C_1$ and the rest of the coupler 200 is small compared to the drive frequency, the potential at node $V_1$ follows the potential on the first object 202. Current is thereby forced through the inductive divider formed by $L_1$ and the sum of $L_2$ and $L_J$. The branch current through $L_2$ is equal to $L_1/(L_2+L_1)$, and second object 204 may then be coupled to this current either galvanically or through a flux transformer.

Inductance $L_J$ of the Josephson element represented by single Josephson junction $J_1$ in FIG. 2A depends on a control current biasing the RF SQUID. For example, $L_J$ can be varied by applying a flux bias to the RF SQUID loop, resulting in a tunable current through $L_2$ and therefore a tunable coupling between the two objects 202, 204. The variable value of $L_J$ thus sets the current in $L_2$ and hence the coupling between first and second objects 202, 204. The values of the capacitor $C_1$ and inductor $L_1$ should be chosen such that $1/\sqrt{(L_1/C_1)} \ll \omega$, where $\omega$ represents the highest characteristic frequency of the coupled objects 202, 204. Exact values for $L_1$ and $C_1$ are dependent on the required coupling strength. Simulations performed in Agilent's Advanced Design Simulation (ADS) tool indicate that, for realistic choices of the capacitance and inductance values, coupler 200 is able to achieve reasonably strong couplings, on the order of 100 megahertz for a model system.

The coupler described herein therefore provides the flexibility to implement tunable couplings at any point along a transmission-line resonator, to enable couplings not possible with tunable couplers that only couple inductively. The capacitively-driven tunable coupler system 100 can be implemented in any of a variety of superconducting circuit systems to provide coupling and decoupling between quantum objects (e.g., qubits, resonators). The signals between the coupled objects can be, for example, microwave signals that are implemented in a control scheme for a quantum circuit, such as performing a gate or a readout operation on a qubit. As another example, the signals can be a signal pulse, a communication signal, or a control command signal. The capacitively-driven tunable coupler system 100 can operate at cryogenic temperatures, can dissipate substantially no power, and can be controlled with single flux quantum (SFQ) compatible signals.

As discussed above, the aforementioned Josephson elements in the RF SQUID of coupler 200 can be Josephson junctions or compound Josephson junctions. The inductance of the Josephson elements can be switched between a low inductance state for coupling quantum objects to one another and to pass signals between the coupled objects, and a high inductance state to decouple the objects from one another to block signals from passing between the objects. The Josephson elements can have a first inductance when no current or a low current is induced in its SQUID, and a second inductance when a current or a higher current is induced in its respective SQUID that is at a predetermined threshold that generates or induces a flux, for example, greater than about 0.1 $\Phi_0$, and less than about 0.45 $\Phi_0$, where $\Phi_0$ is equal to a flux quantum. The first inductance (e.g., $h/2e*1/I_C$, where h is Planck's constant divided by $2\pi$, e is electron charge, and $I_C$ is the critical current of the Josephson junction) can provide coupling between objects, such to allow passing of a desired bandwidth portion of an input signal between objects. The second inductance (e.g., a comparatively large inductance value) can provide decoupling between the objects, such that the passing of the desired bandwidth portion of the input signal is blocked between objects.

Figure 2B:
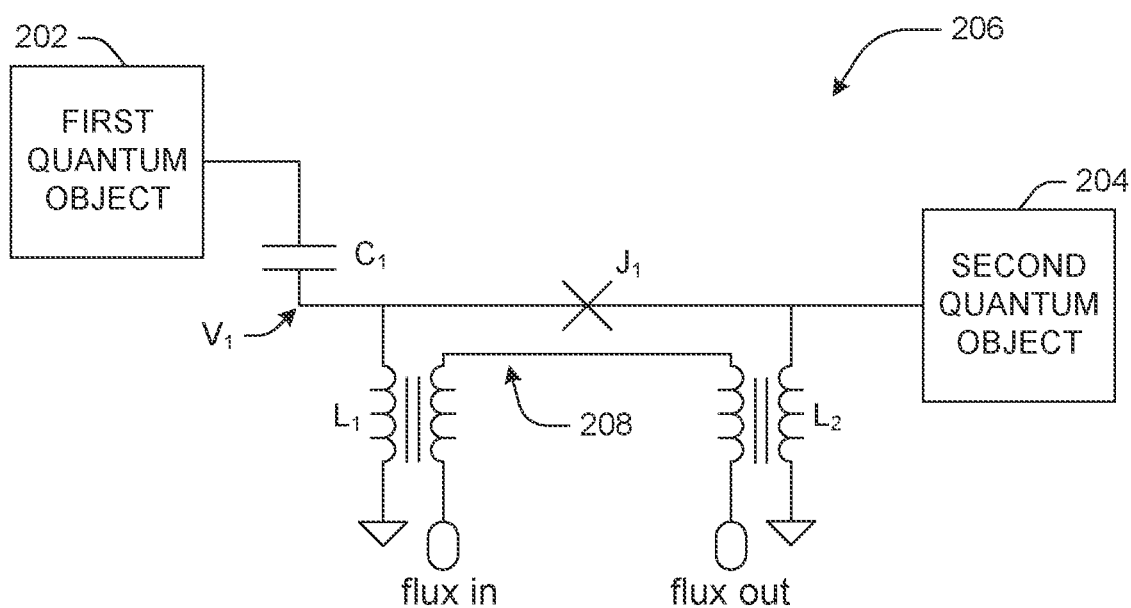
FIGS. 2B-2I are schematic diagrams illustrating various arrangements providing coupling of control flux to the example superconducting capacitively-driven tunable coupler of FIG. 2A.
Figure 2C:
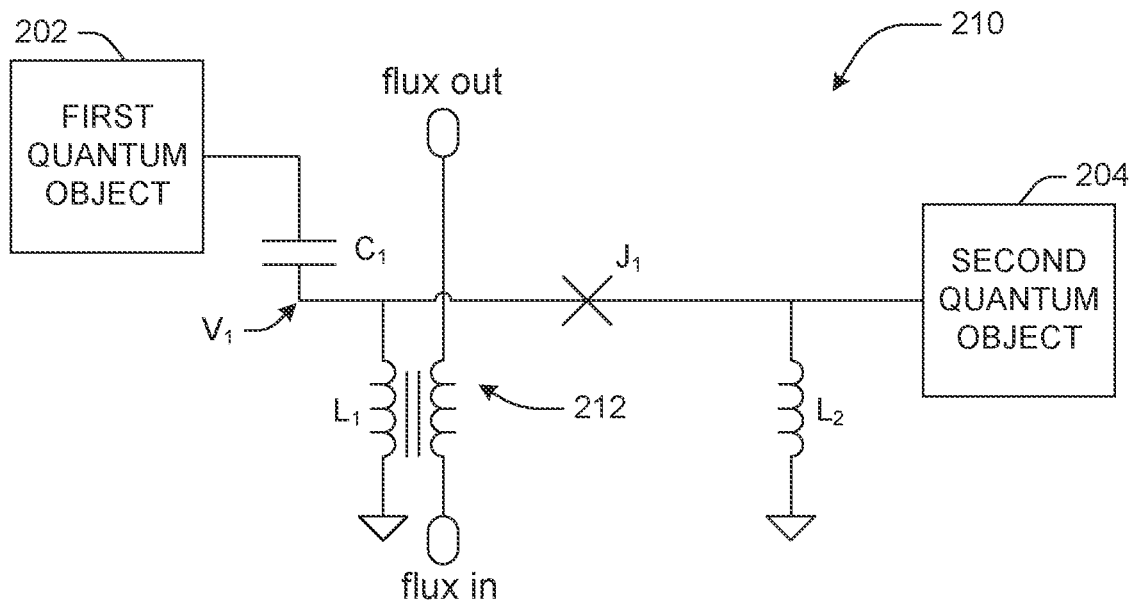
Figure 2D:
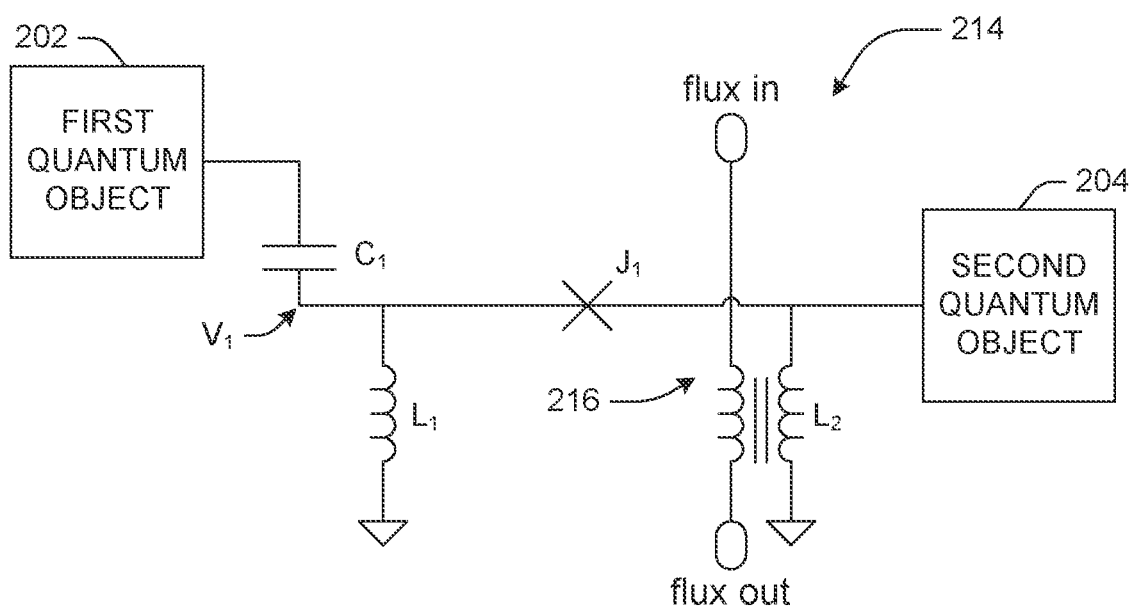
Figure 2E:
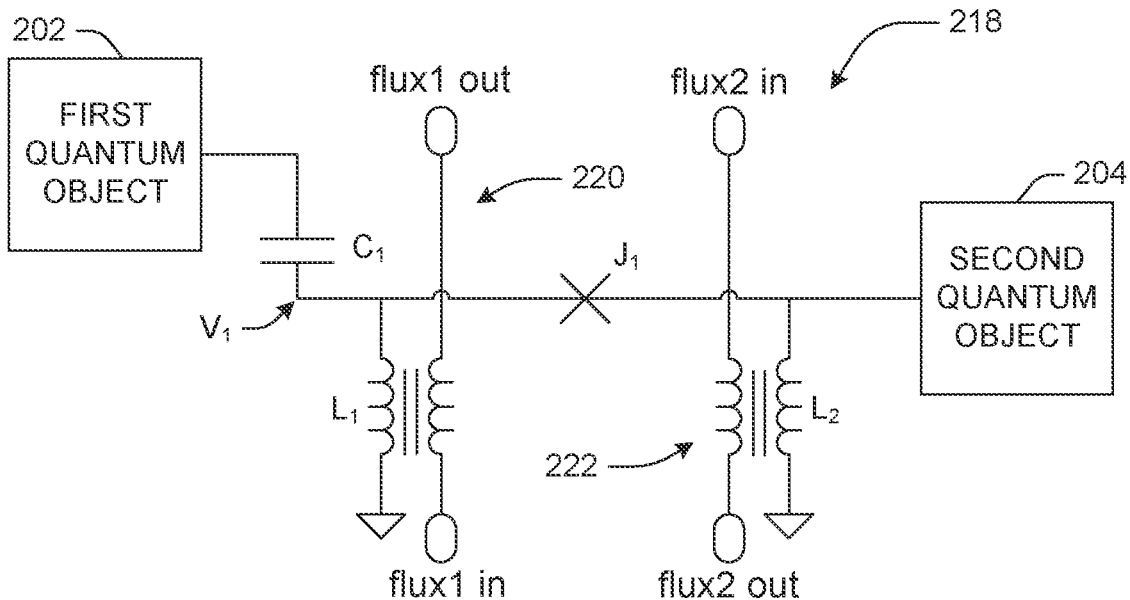

FIGS. 2B-2H illustrate schematic diagrams of couplers having various arrangements for providing flux injection. The variant couplers otherwise function substantially as described above. Example coupler 206 of FIG. 2B provides a single flux bias line 208 capable of providing flux injection by transformer-coupling into inductors $L_1$ and $L_2$. Example coupler 206 of FIG. 2B provides a single flux bias line 208 capable of providing flux injection by transformer-coupling into inductors $L_1$ and $L_2$. Example coupler 210 of FIG. 2C provides a single flux bias line 212 capable of providing flux injection by transformer-coupling into just inductor $L_1$. Example coupler 214 of FIG. 2D provides a single flux bias line 216 capable of providing flux injection by transformer-coupling into just inductor $L_2$. Example coupler 218 of FIG. 2E provides a first flux bias line 220 capable of providing flux injection by transformer-coupling into just inductor $L_1$ and a second flux bias line 222 capable of providing flux injection by transformer-coupling into just inductor $L_2$. Both flux bias lines 220, 222 could be controlled by a single controller such as controller 116 in FIG. 1.

Figure 2F:
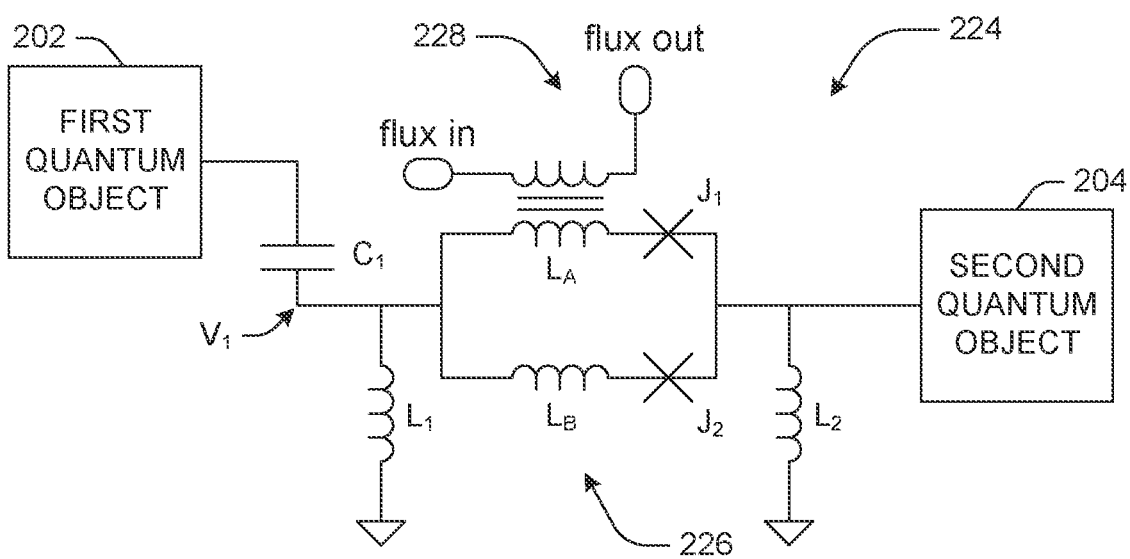
Figure 2G:
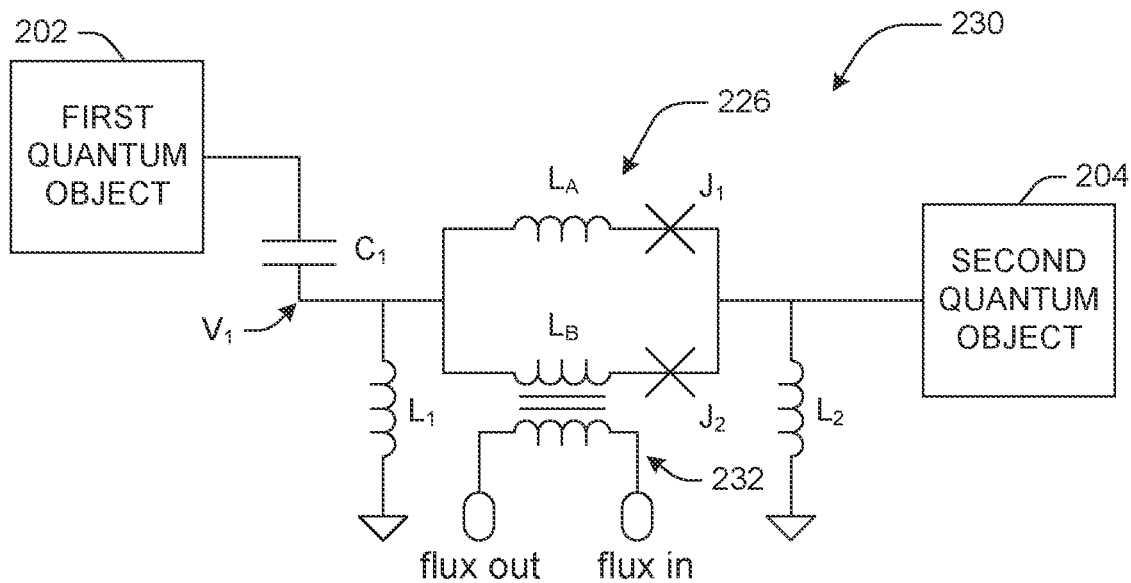
Figure 2H:
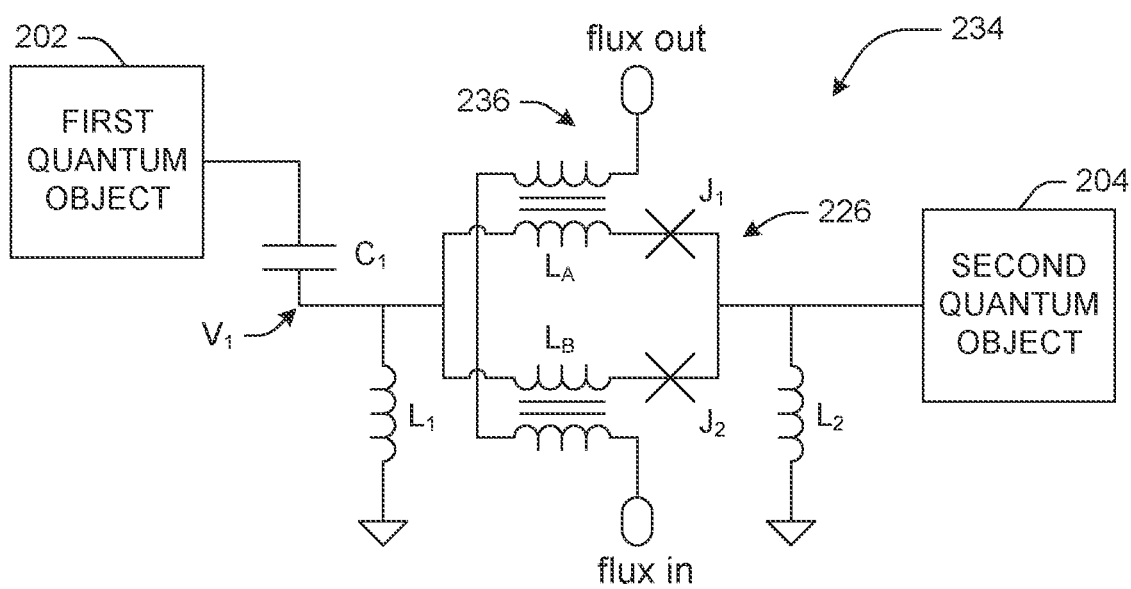
Figure 2I:
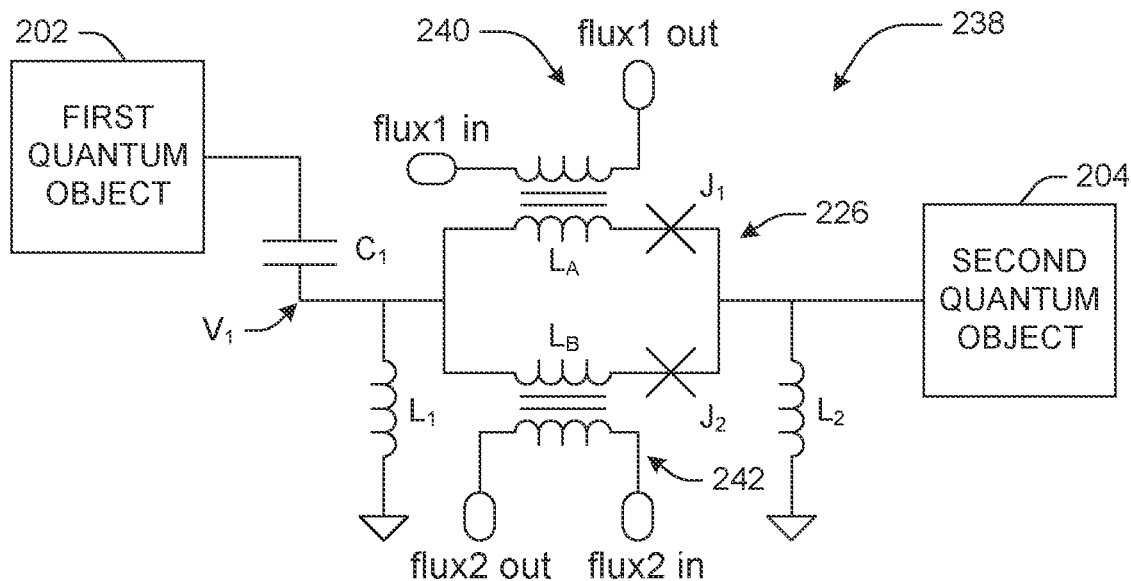

Example couplers 224, 230, 234, and 238 of FIGS. 2F-2I all provide the Josephson element of the RF SQUID as a compound Josephson junction 226 consisting of two Josephson junctions $J_1$, $J_2$ arranged in parallel. The smaller loop of the compound Josephson junction 226 can also include one or more inductors by which flux can be injected into the smaller loop. As illustrated in FIGS. 2F-2I, two such inductors, $L_A$ and $L_B$, are provided in the compound Josephson junction 226. These inductors $L_A$, $L_B$ have comparatively small inductance values as compared to the inductance values of $L_1$ or $L_2$. Example coupler 224 of FIG. 2F provides a single flux bias line 228 capable of providing flux injection into compound Josephson junction 226 by transformer-coupling into just inductor $L_A$. Example coupler 230 of FIG. 2G provides a single flux bias line 232 capable of providing flux injection into compound Josephson junction 226 by transformer-coupling into just inductor $L_B$. Example coupler 234 of FIG. 2H provides a single flux bias line 236 capable of providing flux injection into compound Josephson junction 226 by transformer-coupling into both inductors $L_A$ and $L_B$. Example coupler 238 of FIG. 2I provides a first flux bias line 240 capable of providing flux injection by transformer-coupling into just inductor $L_A$ and a second flux bias line 242 capable of providing flux injection by transformer-coupling into just inductor $L_B$. Both flux bias lines 240, 242 could be controlled by a single controller such as controller 116 in FIG. 1.

Figure 3:
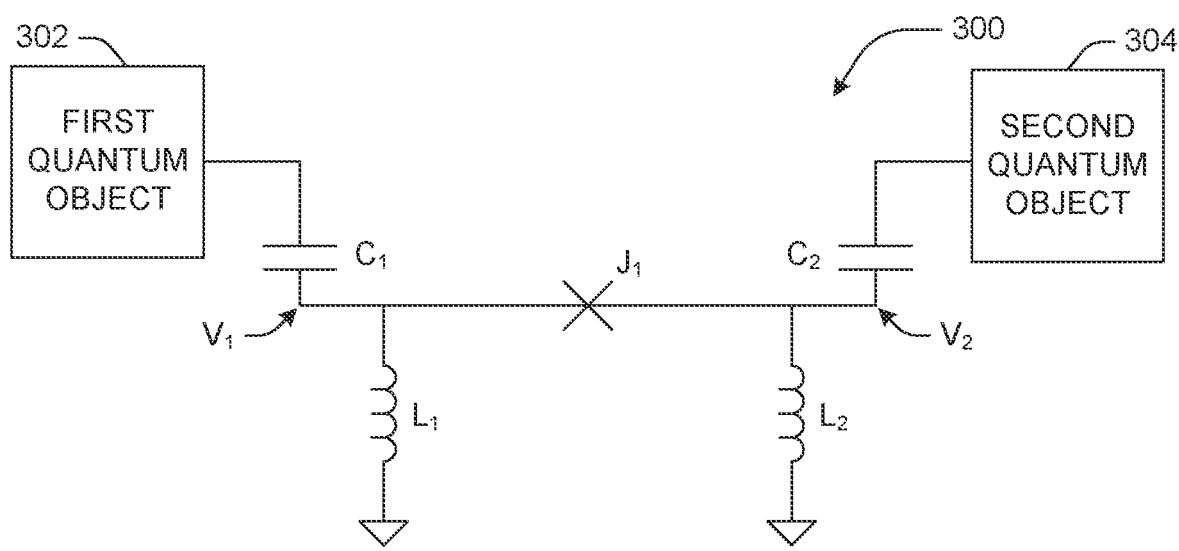
FIG. 3 is a schematic circuit diagram of an example superconducting capacitively-driven tunable coupler having capacitive coupling at both ends of the coupler.

Whereas FIGS. 2A-2I illustrate capacitively-driven tunable couplers that can be used to couple the open end of first quantum object 202 to the ground end of second quantum object 204, coupler 300 illustrated in FIG. 3 can be used to couple the objects 302, 304 by the open ends of both objects. Coupler 300 behaves equivalently to the previously described couplers but further includes an additional coupling capacitor $C_2$ connected on the other end of the RF SQUID at node $V_2$. Flux bias lines, for example, can be provided as flux injection elements in coupler 300 in an equivalent manner as shown in any of FIGS. 2B-2I.

Figure 4:
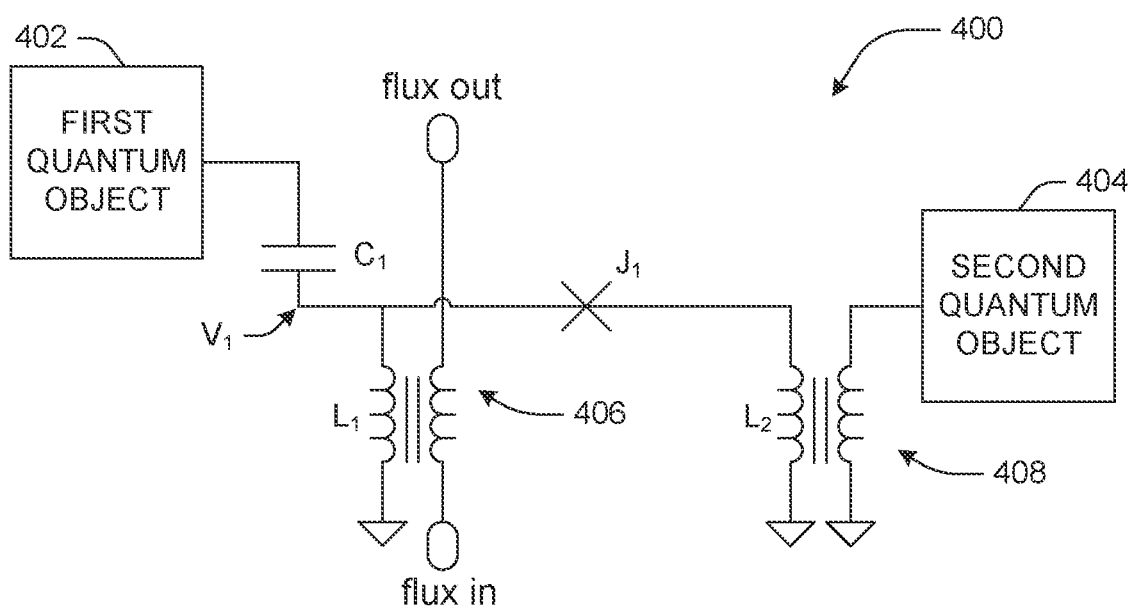
FIG. 4 is a schematic circuit diagram of an example superconducting capacitively-driven tunable coupler having coupling on one side through a flux transformer.

While FIGS. 2A-2I illustrate capacitively driven tunable couplers in which second quantum object 204 is galvanically coupled to the current forced through the inductive divider formed by $L_1$ and the sum of $L_2$ and $L_J$, FIG. 4 illustrates another example capacitively driven tunable coupler in which second quantum object 404 is coupled to this current, and thus to first quantum object 402, through a flux transformer 408 rather than a galvanic connection. Although the coupling control flux line 406 is shown as arranged in the example of circuit 210 in FIG. 2C, the circuit 400 shown in FIG. 4 could also be modified to use the control coupling arrangements 224 of FIG. 2F, 230 of FIG. 2G, 234 of FIG. 2H, or 238 of FIG. 2I.

The capacitively-driven tunable coupler described herein provides the flexibility in systems having an extended object to couple to that object at more than just the ground end of the extended object. The described coupler permits the flexibility to couple at anywhere along the object.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting capacitively-driven tunable coupler system comprising:
   first and second quantum objects each having a ground end required to be connected to a DC path to a low-voltage rail and an open end required not to be connected to a DC path to the low-voltage rail, wherein the ground end of the second quantum object is connected to a second connecting node;
   a coupling capacitor connected between the open end of the first quantum object and a first connecting node;
   a first inductor connected between the first connecting node and the low-voltage rail;
   a Josephson element connected between the first connecting node and the second connecting node; and
   a second inductor connected between the second connecting node and the low-voltage rail.

2. The system of claim 1, wherein the Josephson element is a single Josephson junction.

3. The system of claim 2, further comprising at least one flux bias line transformer-coupled to at least one of the first and second inductor to bias the Josephson element to variably weaken the strength of coupling between the first and second quantum objects.

4. The system of claim 3, further comprising a coupler controller configured to control the setting of the system between coupled and uncoupled states by adjusting an amount of injected flux and thereby varying the inductance of the Josephson element.

5. The system of claim 4, wherein the coupler controller controls an amount and polarity of current through the at least one flux bias line.

6. The system of claim 1, wherein the Josephson element is a compound Josephson junction comprising two Josephson junctions arranged in parallel.

7. The system of claim 6, further comprising at least one flux bias line transformer-coupled to the compound Josephson junction to bias the compound Josephson junction to variably weaken the strength of coupling between the first and second quantum objects.

8. The system of claim 7, further comprising a coupler controller configured to control the setting of the system between coupled and uncoupled states by adjusting an amount of injected flux and thereby varying the inductance of the Josephson element.

9. The system of claim 8, wherein the coupler controller controls an amount and polarity of current through the at least one flux bias line.

10. The system of claim 1, wherein the system further comprises a second coupling capacitor.

11. A superconducting capacitively-driven tunable coupler system comprising:
    first and second quantum objects each having a ground end required to be connected to a DC path to a low-voltage rail and an open end required not to be connected to a DC path to the low-voltage rail;
    a first coupling capacitor connected between the open end of the first quantum object and a first connecting node;
    a first inductor connected between the first connecting node and the low-voltage rail;
    a Josephson element connected between the first connecting node and a second connecting node;
    a second inductor connected between the second connecting node and the low-voltage rail; and
    a second coupling capacitor connected between the second connecting node and the open end of the second quantum object.

12. The system of claim 11, wherein the Josephson element is a single Josephson junction.

13. The system of claim 12, further comprising at least one flux bias line transformer-coupled to at least one of the first and second inductor to bias the Josephson element to variably weaken the strength of coupling between the first and second quantum objects.

14. The system of claim 13, further comprising a coupler controller configured to control the setting of the system between coupled and uncoupled states by adjusting an amount of injected flux and thereby varying the inductance of the Josephson element.

15. The system of claim 14, wherein the coupler controller controls an amount and polarity of current through the at least one flux bias line.

16. The system of claim 11, wherein the Josephson element is a compound Josephson junction comprising two Josephson junctions arranged in parallel.

17. The system of claim 16, further comprising at least one flux bias line transformer-coupled to the compound Josephson junction to bias the compound Josephson junction to variably weaken the strength of coupling between the first and second quantum objects.

18. The system of claim 17, further comprising a coupler controller configured to control the setting of the system between coupled and uncoupled states by adjusting an amount of injected flux and thereby varying the inductance of the Josephson element.

19. The system of claim 18, wherein the coupler controller controls an amount and polarity of current through the at least one flux bias line.

* * * * *